(12) United States Patent
Egawa

(10) Patent No.: US 9,443,573 B2
(45) Date of Patent: Sep. 13, 2016

(54) SEMICONDUCTOR DEVICE INCLUDING MAIN AMPLIFERS BETWEEN MEMORY CELL ARRAYS

(71) Applicant: Hidekazu Egawa, Chuo-Ku (JP)

(72) Inventor: Hidekazu Egawa, Chuo-Ku (JP)

(73) Assignee: Micron Technology, Inc., Boise, ID (US)

(*) Notice: Subject to any disclaimer, the term of this patent is extended or adjusted under 35 U.S.C. 154(b) by 41 days.

(21) Appl. No.: 14/504,045

(22) Filed: Oct. 1, 2014

(65) Prior Publication Data

US 2015/0117078 A1 Apr. 30, 2015

(30) Foreign Application Priority Data

Oct. 2, 2013 (JP) .................. 2013-207139

(51) Int. Cl.
*G11C 7/06* (2006.01)
*G11C 11/4091* (2006.01)
*G11C 5/02* (2006.01)
*G11C 7/10* (2006.01)
*G11C 11/4096* (2006.01)

(52) U.S. Cl.
CPC ............. *G11C 11/4091* (2013.01); *G11C 5/02* (2013.01); *G11C 7/065* (2013.01); *G11C 7/1069* (2013.01); *G11C 7/1096* (2013.01); *G11C 11/4096* (2013.01); *G11C 5/025* (2013.01)

(58) Field of Classification Search
CPC .......... G11C 11/4091; G11C 11/4096; G11C 7/1096; G11C 5/025; G11C 7/065; G11C 7/1069
USPC .......................................................... 365/51
See application file for complete search history.

(56) References Cited

U.S. PATENT DOCUMENTS

| | | | | |
|---|---|---|---|---|
| 8,705,297 B2* | 4/2014 | Kim | .......... | G11C 7/06 365/185.11 |
| 2012/0106281 A1* | 5/2012 | Kim | .......... | G11C 7/06 365/203 |
| 2014/0003113 A1 | 1/2014 | Seno et al. | | |

FOREIGN PATENT DOCUMENTS

JP            2010140579 A        6/2010

* cited by examiner

*Primary Examiner* — Richard Elms
*Assistant Examiner* — Xiaochun L Chen
(74) *Attorney, Agent, or Firm* — Schwegman Lundberg & Woessner, P.A.

(57) ABSTRACT

A semiconductor device includes a plurality of main amplifiers provided between memory cell arrays. One of the main amplifiers is disposed closer to one of the memory cell arrays than to the other of memory cell arrays, and the other of the main amplifiers is disposed closer to the other of the memory cell arrays than to the one of the memory cell arrays. Additional apparatus are disclosed.

20 Claims, 16 Drawing Sheets

SEMICONDUCTOR DEVICE INCLUDING MAIN AMPLIFERS BETWEEN MEMORY CELL ARRAYS

RELATED APPLICATION

This application is based upon and claims the benefit of priority from Japanese Patent Application No. 2013-207139, filed on Oct. 2, 2013, the disclosure of which is incorporated herein by reference in its entirety.

BRIEF DESCRIPTION OF THE DRAWINGS

The features and advantages of the various embodiments will be more apparent from the following detailed description, taken in conjunction with the accompanying drawings, in which.

DETAILED DESCRIPTION

In some embodiments, in a memory-based semiconductor device such as a DRAM (Dynamic Random Access Memory) or the like, read data is read out from a memory cell array, and is amplified by a main amplifier, and the amplified data is then transferred to a read/write bus. On the other hand, during a writing operation, write data is supplied through the read/write bus from the outside of the DRAM, and then is written into a memory cell array through the main amplifier. Readers that desire to learn more about related devices may refer to Japanese Patent Application Laid Open No. 2010-140579.

In some embodiments, the main amplifier is disposed along one end of the memory cell array. In some embodiments, the main amplifier is disposed in such a manner as to be sandwiched between two memory arrays that are disposed adjacent to each other.

In some embodiments, when the main amplifier is disposed so as to be sandwiched between two memory cell arrays, a control signal for use in carrying out a read/write operation on one of the memory cell arrays and a control signal for use in carrying out a read/write operation on the other memory cell array may be supplied to one main amplifier.

In this case, in order to equalize signal conductor loads for transmitting these two control signals, the main amplifier may be disposed in the center of the two memory cell arrays. However, such an arrangement is sometimes difficult due to limitations on the layout.

Figure 1:
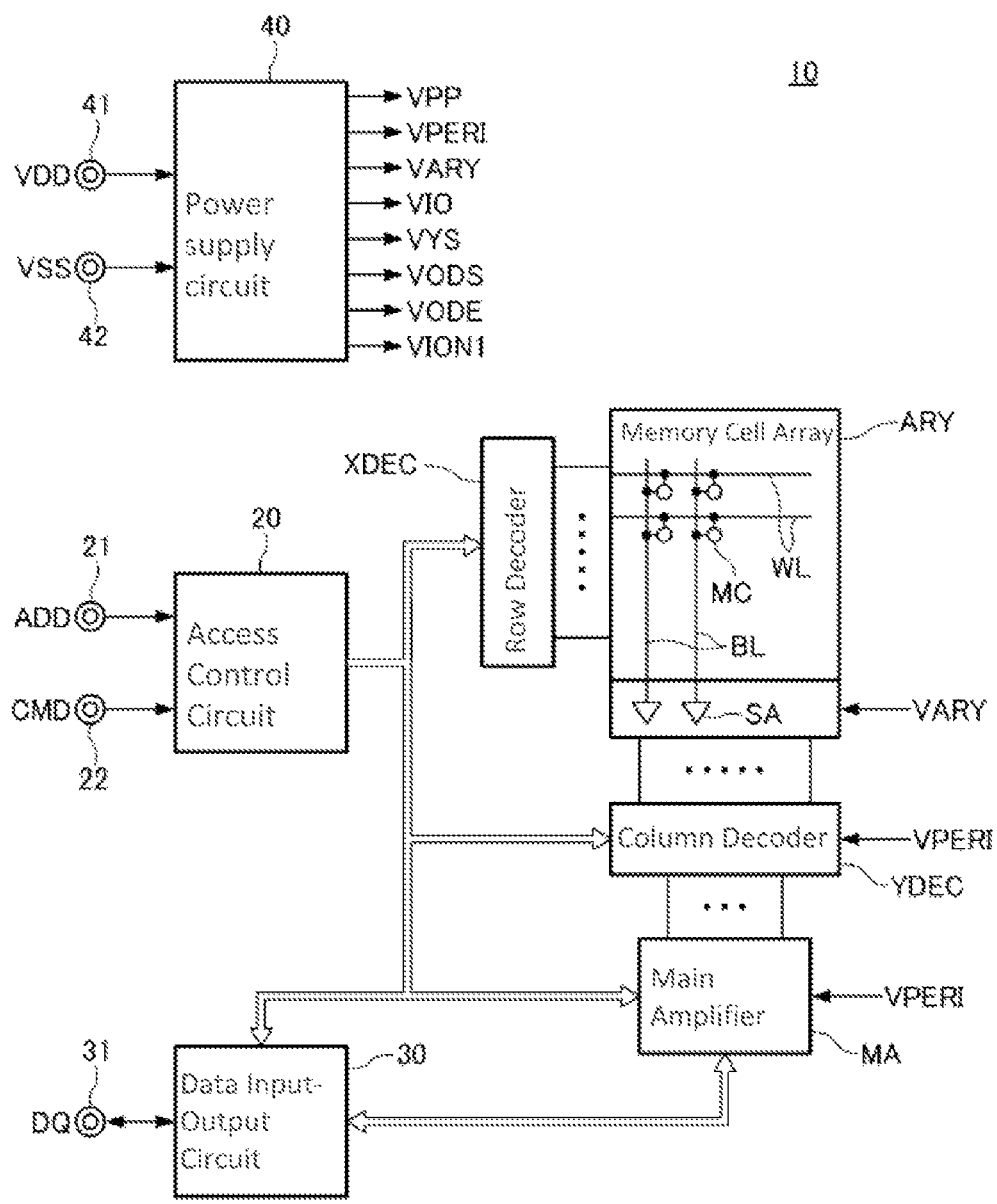
FIG. 1 is a block diagram that shows an entire configuration of a semiconductor device 10 in accordance with various embodiments.

FIG. 1 is a block diagram showing an entire configuration of a semiconductor device 10 in accordance with various embodiments.

The semiconductor device 10 may be a DRAM, and may include a memory cell array ARY, as shown in FIG. 1. In the memory cell array ARY, a plurality of word lines WL and a plurality of bit lines BL, which intersect with each other, are installed, and memory cells MC are disposed on the intersections thereof.

The word lines WL are selected by a row decoder XDEC, and the bit lines BL are selected by a column decoder YDEC. The bit lines BL are respectively connected to the corresponding sense amplifiers SA, and a bit line BL selected by the column decoder YDEC is electrically connected to a main amplifier MA through a sense amplifier SA.

The row decoder XDEC, the column decoder YDEC, the sense amplifier SA and the main amplifier MA are controlled by an access control circuit 20. The access control circuit 20 receives an address signal ADD and a command signal CMD through external terminals 21 and 22. Based upon these signals, the access control circuit 20 controls the low decoder XDEC, the column decoder YDEC, the sense amplifier SA, the main amplifier MA and a data input-output circuit 30.

In some embodiments, when the access control circuit 20 identifies the command signal CMD as an active command, it sends the address signal ADD to the row decoder XDEC. In response, the row decoder XDEC selects a word line WL indicated by the address signal ADD so that the corresponding memory cells MC are respectively connected to the bit lines BL. Thereafter, the access control circuit 20 activates the respective sense amplifier SA in a predetermined timing.

On the other hand, when the access control circuit 20 identifies the command signal CMD as a read command or a write command, it sends the address signal ADD to the column decoder YDEC. In response, the column decoder YDEC connects the bit line BL indicated by the address signal ADD to the respective main amplifier MA. Thus, at the time of a read operation, read data DQ is read out from the memory cell array ARY through the sense amplifier, is externally outputted from a data input-output terminal 31 through the main amplifier MA and the data input-output circuit 30. Moreover, at the time of a write operation, write data DQ is externally supplied through the data input-output terminal 31 and the data input-output circuit 30, and is written in the memory cell MC through the main amplifier MA and the sense amplifier SA.

The power supply circuit 40 as shown in FIG. 1 receives an external power source VDD and a ground source VSS respectively through power supply terminals 41 and 42. The power supply circuit, based upon the external power source VDD and the ground source VSS, generates inner voltages VPP, VPERI, VARY, VIO, VYS, VODS, VODE, VION1 and the like. The inner voltage VPP is generated by raising the external power source supply voltage VDD. The inner voltages VPERI, VARY, VIO, VYS, VODS, VODE and VION1 are generated by lowering the external power source supply voltage VDD.

The inner voltage VPP is a voltage mainly used for the row decoder XDEC. The row decoder XDEC drives the word line WL selected based upon the address signal ADD to a VPP level so that a cell transistor in the memory cell MC is made conductive. The inner voltage VARY is a voltage mainly used for the sense amplifier SA. When the sense amplifier SA is activated, the read data that has been read out is amplified by driving one of the bit paired lines to a VARY level, with the other bit line being driven to a VSS level. The inner voltage VPERI is used as an operational voltage for most of peripheral circuits, such as an access control circuit 20 or the like. By using the inner voltage VPERI lower than the voltage of the external voltage VDD as the operational voltage for these peripheral circuits, it is possible to achieve a low power consumption of the semiconductor device 10.

The inner voltage VIO is a voltage used for write amplifiers WAMPU and WAMPL, which will be described later. The inner voltage VYS is a voltage used for controlling a column switch. The inner voltages VODS and VODE are overdrive voltages of the sense amplifier SA. Therefore, the inner voltages VODS and VODE are slightly higher voltages in comparison with the inner voltage VARY. Among these voltages, the inner voltage VODS is used for maintaining an overdrive voltage during a stand-by time. Therefore, the inner voltages VODS and VODE are mutually set to the same voltage.

Figure 2:
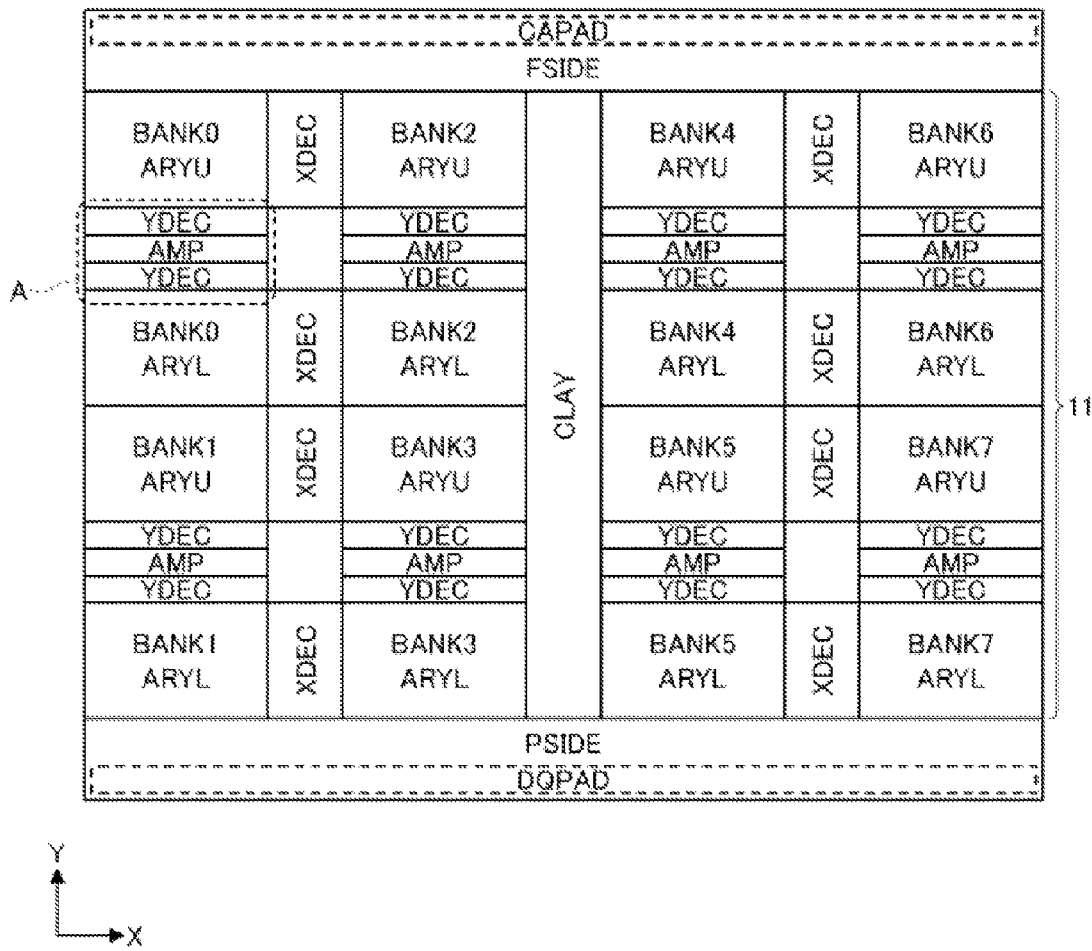
FIG. 2 is a schematic plan view showing a layout of the semiconductor device 10.

FIG. 2 is a substantial plan view showing the layout of the semiconductor device 10.

As shown in FIG. 2, the semiconductor device 10 may include a semiconductor chip, which includes an array region 11 composed of 8 memory banks BANK0 to BANK7, and peripheral circuit regions located on the two sides in the Y-direction of the array region 11.

The peripheral circuit regions include a first peripheral circuit region PSIDE including a pad area DQPAD disposed along the peripheral edge portion of the semiconductor chip, and a second peripheral circuit region FSIDE that is disposed along a peripheral edge of the semiconductor chip on a side opposite to the first peripheral circuit region PSIDE and includes a pad area CAPAD. In some DRAMs, the pad area is formed in the center of the semiconductor chip. However, in a case when there are a large number of data input-output terminals 31 (as shown in FIG. 1) (for example, 32 terminals), it might become difficult to form the pad area in the center of a semiconductor chip. In such a case, as shown in the drawing, a plurality of pad areas are formed on the peripheral edge of the semiconductor chip. Moreover, in a conductor region CLAY formed between the memory banks BANK0 to BANK3 and the memory banks BANK4 to BAND7, a conductor is formed so as to connect the peripheral circuit region FSIDE and the peripheral circuit region PSIDE.

On the first peripheral circuit region PSIDE, an output buffer for outputting read data to the data input-output terminal 31 formed in the pad area DQPAD and an input receiver for receiving write data supplied through the data input-output terminal 31 are formed. In the second peripheral circuit region FSIDE, an input receiver that receives an address inputted through external terminals 21 and 22 (see FIG. 1) formed in the pad area CAPAD and an address latch circuit for use in latching the address are formed.

Each of the memory banks BANK0 to BANK7 is provided with two memory cell arrays ARYU and ARYL arranged in the Y-direction, a row decoder XDEC placed on one side in the X-direction of the memory cell arrays ARYU and ARYL, and a column decoder YDEC, as well as a main amplifier region AMP disposed between the two memory cell arrays ARYU and ARYL. The row decoder XDEC and the column decoder YDEC are installed for each of the memory cell arrays ARYU and ARYL, while the main amplifier region AMP is commonly installed onto the two memory cell arrays ARYU and ARYL forming the corresponding memory bank. The main amplifier region AMP forms a region, in which the main amplifiers MA shown in FIG. 1 are disposed.

Figure 3:
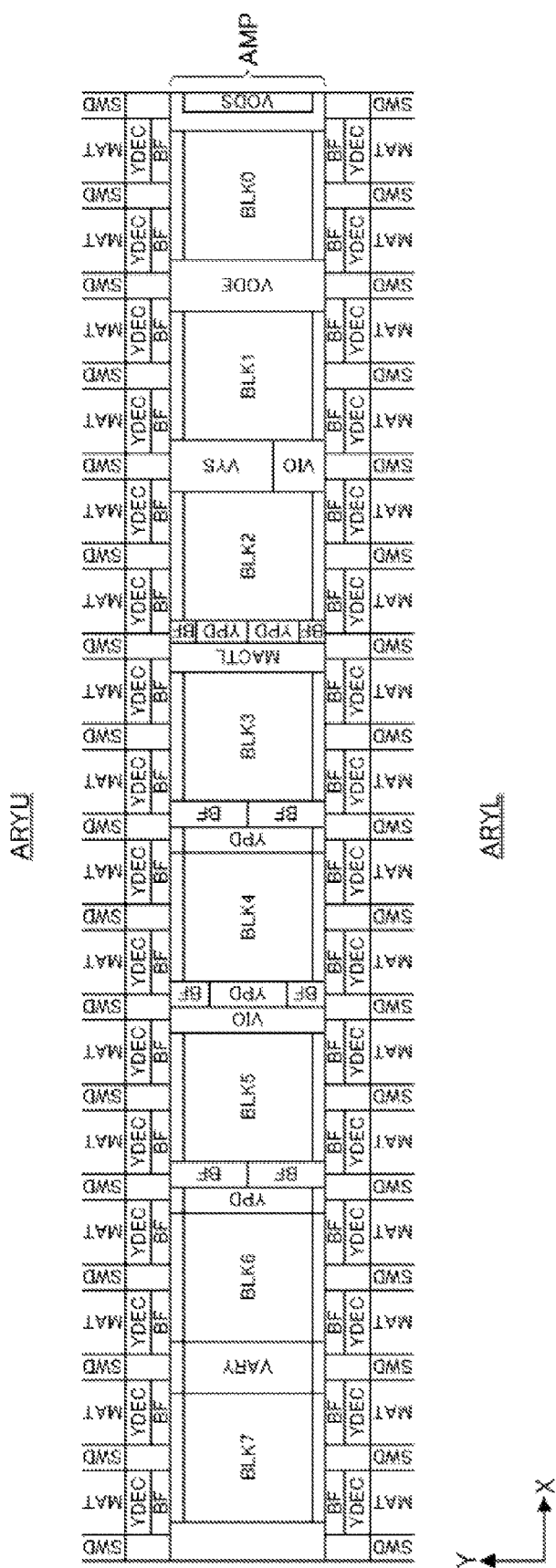
FIG. 3 is a layout view showing a region A as shown in FIG. 2 in an enlarged manner.

FIG. 3 is a layout view showing a region A as shown in FIG. 2 in an enlarged manner.

As shown in FIG. 3, each of the memory cell arrays ARYU and ARYL includes a plurality of memory mats MAT and sub-word drivers SWD disposed on the two sides in the X-direction of the memory mats MAT. The memory mats MAT form regions, in which the word lines WL, the bit lines BL and the memory cells MC are formed. The word lines WL is selected by the sub-word drivers SWD under control of the row decoder XDEC. The bit lines BL is selected by the column switch, not shown, under control of the column decoder YDEC.

The column decoder YDEC receives an output signal from a predecoder YPD through the buffer circuit BF, for selecting the predetermined bit line BL. The predecoder YPD is a circuit for pre-decoding a column address, and is disposed in the main amplifier region AMP, as shown in FIG. 3. Some of the buffer circuits BF are disposed adjacent to the column decoder YDEC. Some of the buffer circuits BF are disposed between the main amplifier blocks BLK. The predecoder YPD, the control circuit MACTL and the like are also disposed between the main amplifier blocks BLK.

As shown in FIG. 3, eight main amplifier blocks BLK0 to BLK7 are disposed in the main amplifier region AMP. Moreover, as described earlier, between the main amplifier blocks BLK that are adjacent to each other in the X-direction, various circuit blocks, such as the predecoder YPD, the control circuit MACTL, the buffer circuit BF and the like, are disposed. Unless otherwise specified, in the following description, the main amplifier blocks BLK0 to BLK7 are sometimes referred to simply as "main amplifier blocks BLK".

The main amplifier blocks BLK are assigned to memory mats MAT corresponding to two rows included in the memory cell array ARYU on one of the sides (e.g., the upper side) in the Y-direction and memory mats MAT corresponding to two rows included in the memory cell array ARYL on the other side (e.g., the lower side) in the Y-direction. In some embodiments, main data conductors corresponding to 4 bits are assigned to one memory mat row. The main data conductors refer to conductors in the Y-direction that connect the memory cell arrays ARYU and ARYL to the main amplifier blocks BLK. With respect to the main data conductors, two wires per one bit may be used to transmit read data and write data in the form of a complimentary signal. An example of a possible form of the memory mat structure is disclosed in U.S. Patent publication No. 2014/0003113. The disclosure of the above Document is incorporated herein by reference in their entirety.

Figure 4:
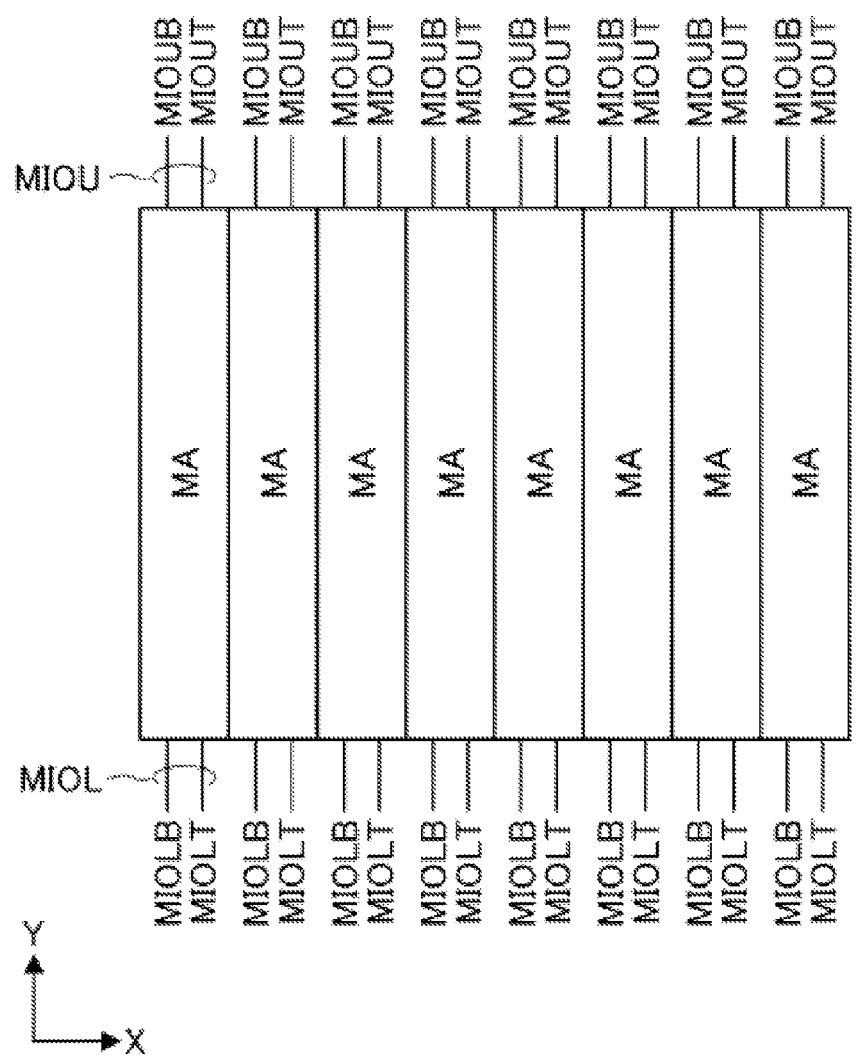
FIG. 4 is a block diagram showing a configuration of a main amplifier block BLK.

FIG. 4 is a block diagram showing a configuration of main amplifier blocks BLK.

As shown in FIG. 4, each of the main amplifier blocks BLK may include eight main amplifiers MA arranged in the X-direction. One of the main amplifiers MA may be connected to a pair of main data conductors MIOU (MIOUT/MIOUB) assigned to the memory cell array ARYU and a pair of main data conductors MIOL (MIOLT/MIOLB) assigned to the memory cell array ARYL.

Figure 5:
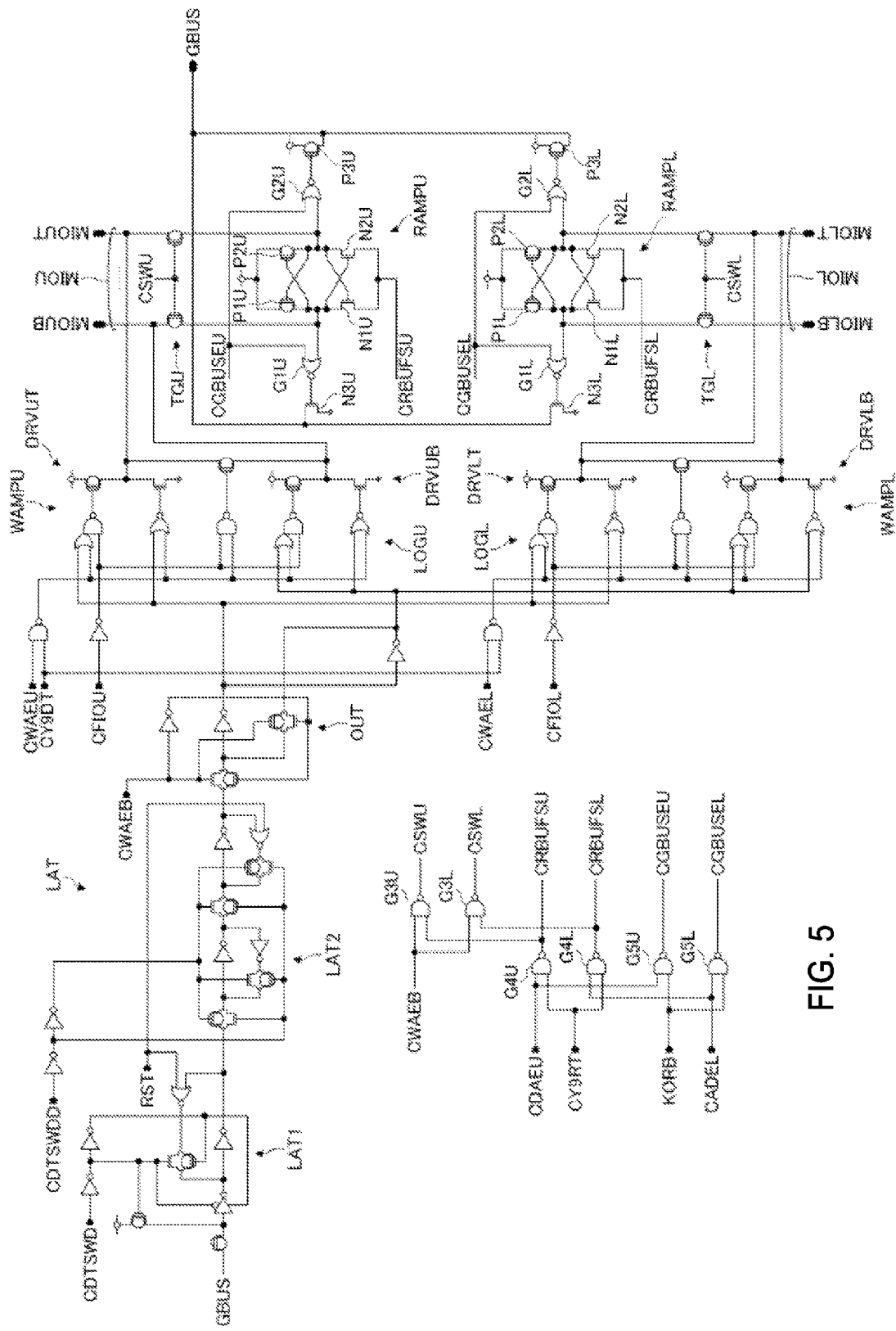
FIG. 5 is a circuit diagram showing a main amplifier MA.

FIG. 5 is a circuit diagram showing the main amplifier MA.

As shown in FIG. 5, the main amplifier MA is provided with read amplifiers RAMPU and RAMPL, as well as write amplifiers WAMPU and WAMPL.

The read amplifier RAMPU is provided with P-channel-type metal-oxide semiconductor (MOS) transistors P1U and P2U cross-coupled to each other, and N-channel-type MOS transistors N1U and N2U cross-coupled to each other, and activated in response to a control signal CRBUFSU. The input-output node of the read amplifier RAMPU is connected to a pair of main data conductors M1OU assigned to the memory cell array ARYU through a connection circuit TGU. The connection circuit TGU may include a P-channel-type MOS transistor, and a control signal CSWU may be supplied to its gate electrode. With this configuration, when the control signals CRBUFSU and CSWU are activated, read data transferred through the main data conductor MIOU are amplified by the read amplifier RAMPU. An output signal from the read amplifier RAMPU is outputted to a read/write bus GBUS through NOR gate circuits G1U and G2U and driver transistors N3U and P3U, which are activated by a control signal CGBUSEU.

In some embodiments, various kinds of control signals for controlling the read amplifier RAMPU, the control signals CSWU, CRBUFSU and CGBUSEU may be generated by respective gate circuits G3U to G5U.

The read amplifier RAMPL is provided with P-channel-type MOS transistors P1L and P2L cross-coupled to each other and N-channel-type MOS transistors N1L and N2L cross-coupled to each other, and is activated in response to a control signal CRBUFSL. The input-output node of the read amplifier RAMPL is connected to a pair of main data wires M1OL assigned to the memory cell array ARYL through a connection circuit TGL. The connection circuit TGL may include a P-channel-type MOS transistor, and a control signal CSWL may be supplied to its gate electrode. With this configuration, when the control signals CRBUFSL and CSWL are activated, read data transferred through the main data wire MIOL is amplified by the read amplifier RAMPL. An output signal from the read amplifier RAMPL is outputted to a read/write bus GBUS through NOR gate circuits G1L and G2L and driver transistors N3L and P3L, which are activated by a control signal CGBUSEL.

In some embodiments, the various kinds of control signals for controlling the read amplifier RAMPL, the control signals CSWL, CRBUFSL and CGBUSEL may be generated by respective gate circuits G3L to G5L.

The write amplifier WAMPU is provided with driver circuits DRVUT and DRVUB that respectively drive a pair of main data conductors MIOU assigned to the memory array ARYU, and a logical circuit LOG U for controlling these driver circuits DRVUT and DRVUB. To the logical circuit LOG U, control signals CY9DT, CWAEU and CFIOU, as well as complementary write data, which are transmitted through a group of latch circuits LAT, are supplied. Moreover, by a circuit configuration as shown in FIG. 5, when the control signals CY9DT and CWAEU are activated, the driver circuits DRVUT and DRVUB may drive one of the main data conductors MIOUT and MIOUB to a high level, and may also drive the other data conductor to a low level in accordance with the write data. Furthermore, when at least one of the control signals CY9DT and CWAEU is brought into a non-active state, with the control signal CFIOU being set to an active state, the driver circuits DRVUT and DRVUB may precharge both of the main data conductors MIOUT and MIOUB to high levels.

The write amplifier WAMPL is provided with driver circuits DRVLT and DRVLB that respectively drive a pair of main data conductors MIOL assigned to the memory array ARYL, and with a logical circuit LOG L for controlling these driver circuits DRVLT and DRVLB. To the logical circuit LOG L, control signals CY9DT, CWAEL and CFIOL, as well as complementary write data, which are transmitted through a group of latch circuits LAT, are supplied. Moreover, by a circuit configuration as shown in FIG. 5, when the control signals CY9DT and CWAEL are activated, the driver circuits DRVLT and DRVLB may drive one of the main data conductors MIOLT and MIOLB to a high level, and may also drive the other data wire to a low level in accordance with the write data. Furthermore, when at least one of the control signals CY9DT and CWAEL is brought into a non-active state, with the control signal CFIOL being set to an active state, the driver circuits DRVLT and DRVLB may precharge both of the main data conductors MIOLT and MIOLB to high levels.

The high level electric potential of the driver circuits DRVUT, DRVUB, DRVLT and DRVLB may be set to the inner voltage VPERI, or an inner voltage VIO different from the inner voltage VPERI may be used in the case when a writing margin is to be changed step by step.

The group of latch circuits LAT may have a configuration, in which a latch circuit LAT1 for carrying out a latch operation for write data in response to a control signal CDTSWD, a latch circuit LAT2 for carrying out a latch operation for write data in response to a control signal CDTSWDD, and an output circuit OUT for outputting write data to the logical circuits LOG U and LOG L in response to a control signal CWAEB are connected in series with one after another. The write data is inputted to the group of latch circuits LAT through the read/write bus GBUS. Moreover, the latch circuits LAT1 and LAT2 are reset by an activation of a reset signal RST.

The read amplifier RAMPU, the write amplifier WAMPU and the gate circuits G3U to G5U are assigned to the main cell array ARYU. Moreover, the read amplifier RAMPL, the write amplifier WAMPL, and the gate circuits G3L to G5L are assigned to the main cell array ARYL. The latch circuits LAT are commonly assigned to the memory cell arrays ARYU and ARYL.

The control signal CDAEU to be inputted to the gate circuits G4U and G5U, and the control signals CWAEU and CFIOU to be inputted to the write amplifier WAMPU are assigned to the memory cell array ARYU. For example, when the control signal CDAEU is activated, read data read out from the memory cell array ARYU through the main data conductor MIOU may be amplified by the main amplifier MA, and when the control signal CWAEU is activated, write data may be transferred to the main data conductor MIOU by the main amplifier MA and written in the memory cell array ARYU.

The control signal CDAEL to be inputted to the gate circuits G4L and G5L, and the control signals CWAEL and CFIOL to be inputted to the write amplifier WAMPL are assigned to the memory cell array ARYL. For example, when the control signal CDAEL is activated, read data read out from the memory cell array ARYL through the main data conductor MIOL may be amplified by the main amplifier MA, and when the control signal CWAEL is activated, write data may be transferred to the main data conductor MIOL by the main amplifier MA and written in the memory cell array ARYL.

In some embodiments, a control signal CY9RT to be inputted to the gate circuits G4U and G4L, a control signal KORB to be inputted to the gate circuits G5U and G5L, a control signal CY9DT to be inputted to the write amplifiers WAPU and WAMPL, and control signals CDTSWD, CDTSWDD and CWAEB to be inputted to the group of latch circuits LAT may be commonly assigned to the memory arrays ARYU and ARYL.

In this manner, in the main amplifier MA, circuits assigned to the memory cell array ARYU, circuits assigned to the memory cell array ARYL, and circuits commonly assigned to the memory cell arrays ARYU and ARYL may be located in a mixed manner. In accordance with this configuration, with respect to control signals to be inputted to the main amplifier MA, control signals assigned to the memory cell array ARYU, control signals assigned to the memory cell array ARYL, and control signals commonly assigned to the memory cell arrays ARYU and ARYL may be required.

Figure 6:
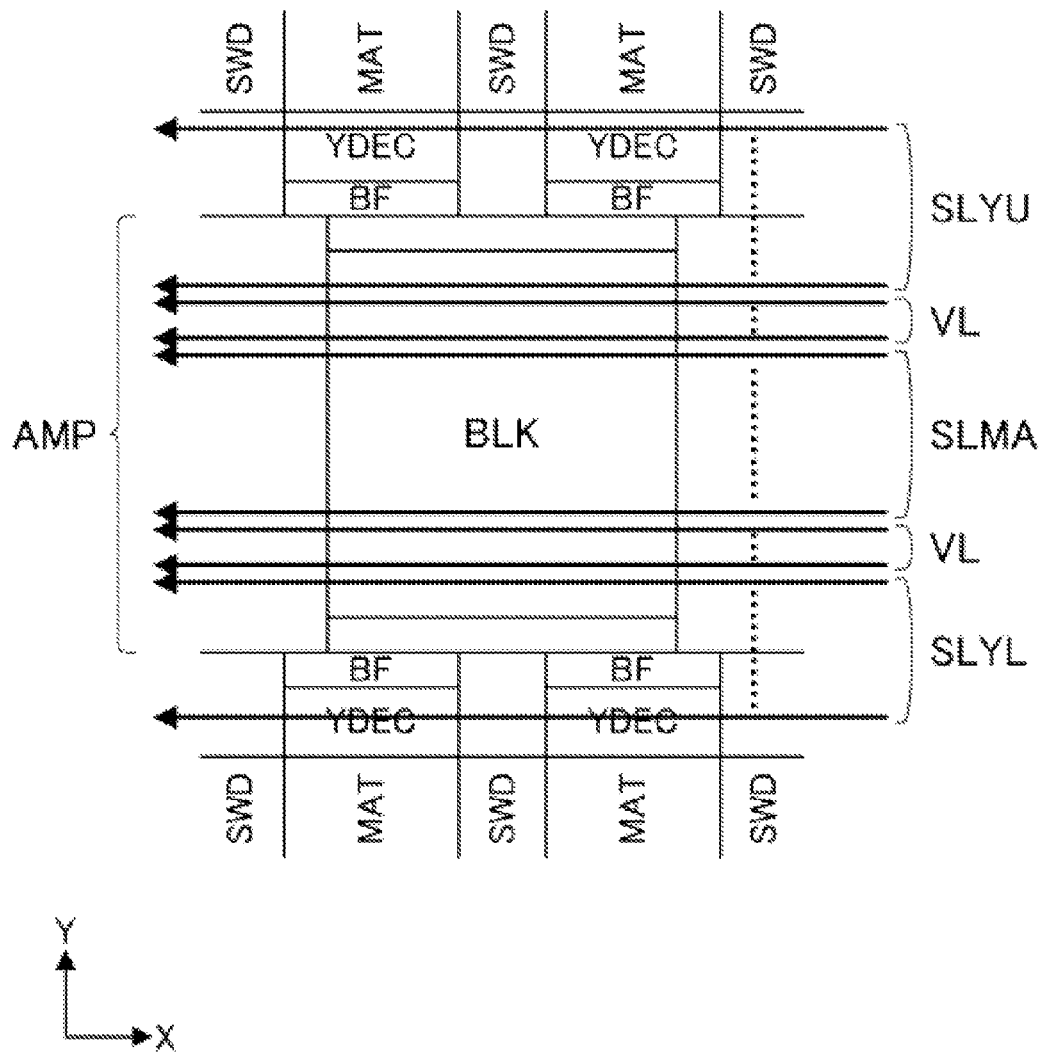
FIG. 6 is a top view illustrating a main amplifier region AMP.

FIG. 6 is a top view showing wires installed on the main amplifier region AMP.

As shown in FIG. 6, on the main amplifier region AMP, a signal conductor SLMA for inputting a control signal to the main amplifier MA, a signal conductor SLYU for inputting a control signal to the column decoder YDEC for the memory cell array ARYU, a signal conductor SLYL for inputting a control signal to the column decoder YDEC for the memory cell array ARYL, and a power supply conductor VL are formed in a manner so as to extend in the X-direction.

Figure 7:
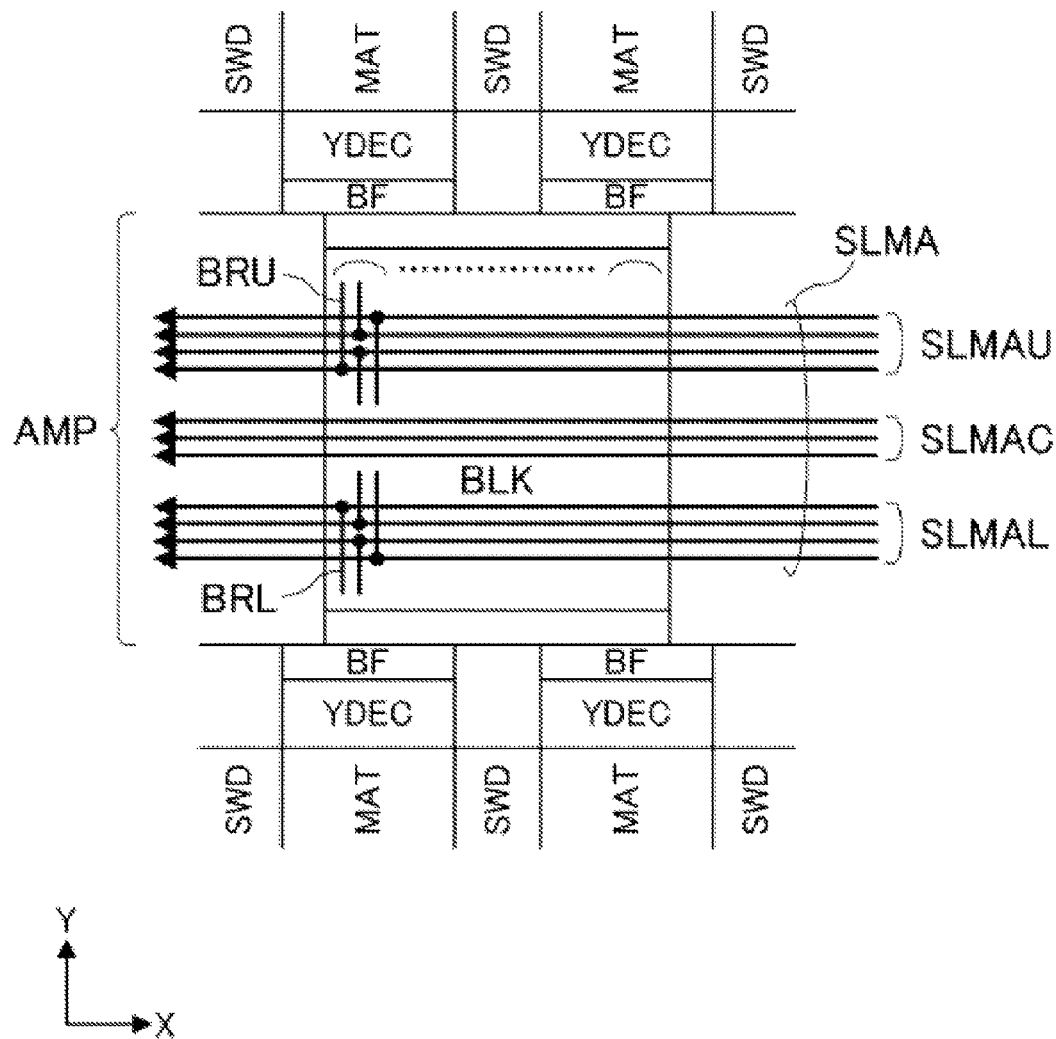
FIG. 7 is a top view illustrating the main amplifier region AMP to show a signal conductor SLMA for the main amplifier MA.

In some embodiments, as shown in FIG. 7, the signal conductor SLMA may include a signal conductor SLMAU for transmitting a control signal (such as the control signal CDAEU, CWAEU, CFIOU or the like) assigned to the memory cell array ARYU, a signal conductor SLMAL for transmitting a control signal (such as the control signal CDAEL, CWAEL, CFIOL or the like) assigned to the memory cell array ARYL, and a signal conductor SLMAC for transmitting a control signal (such as the control signal CY9RT, KORB, CY9DT, CDTSWD, CDTSWDD, CWAEB or the like) commonly assigned to the memory cell arrays ARYU and ARYL.

Any of the signal wires SLMAU, SLMAL and SLMAC may be commonly assigned to a plurality of main amplifiers MA inside the main amplifier region AMP. In such a case, the signal conductor SLMAU may be connected to a circuit inside the main amplifier MA, which is assigned to the memory cell array ARYU side, through a branch conductor BRU extending in the Y-direction. In the same manner, the signal conductor SLMAL may be connected to a circuit inside the main amplifier MA, which is assigned to the memory cell array ARYL side, through a branch conductor BRL extending in the Y-direction.

In some embodiments, the branch wires BRU and BRL are formed on a conductor layer located as a lower layer that is lower than an upper conductor layer on which the signal conductor SLMA is formed. Normally, the conductor formed on the conductor layer of the lower layer has a higher resistance value in comparison with that of the conductor formed on the conductor layer of the upper layer. At least for this reason, the conductor length of the branch conductor BRU and the conductor length of the branch conductor BRL are designed so as to be made coincident as precisely as possible, and thus, it might become possible to reduce a difference in characteristics between a case in which a read/write operation is carried out on the memory cell array ARYU and a case in which a read/write operation is carried out on the memory cell array ARYL.

Figure 8:
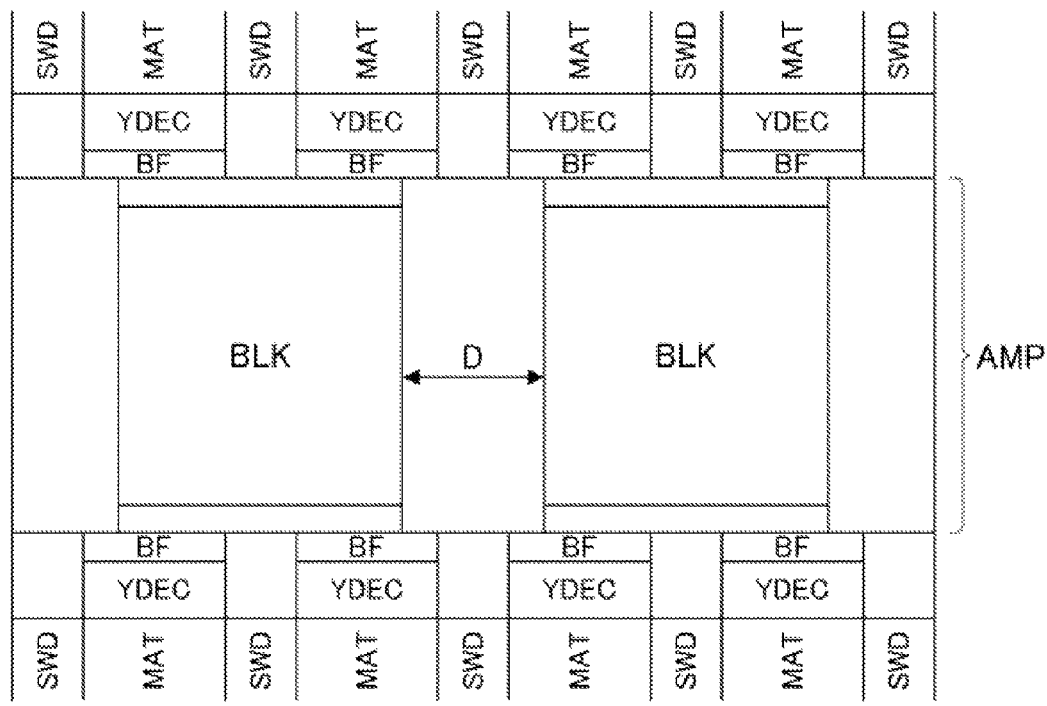
FIG. 8 is a top view showing a layout of the main amplifier region AMP before shrinkage.
Figure 9:
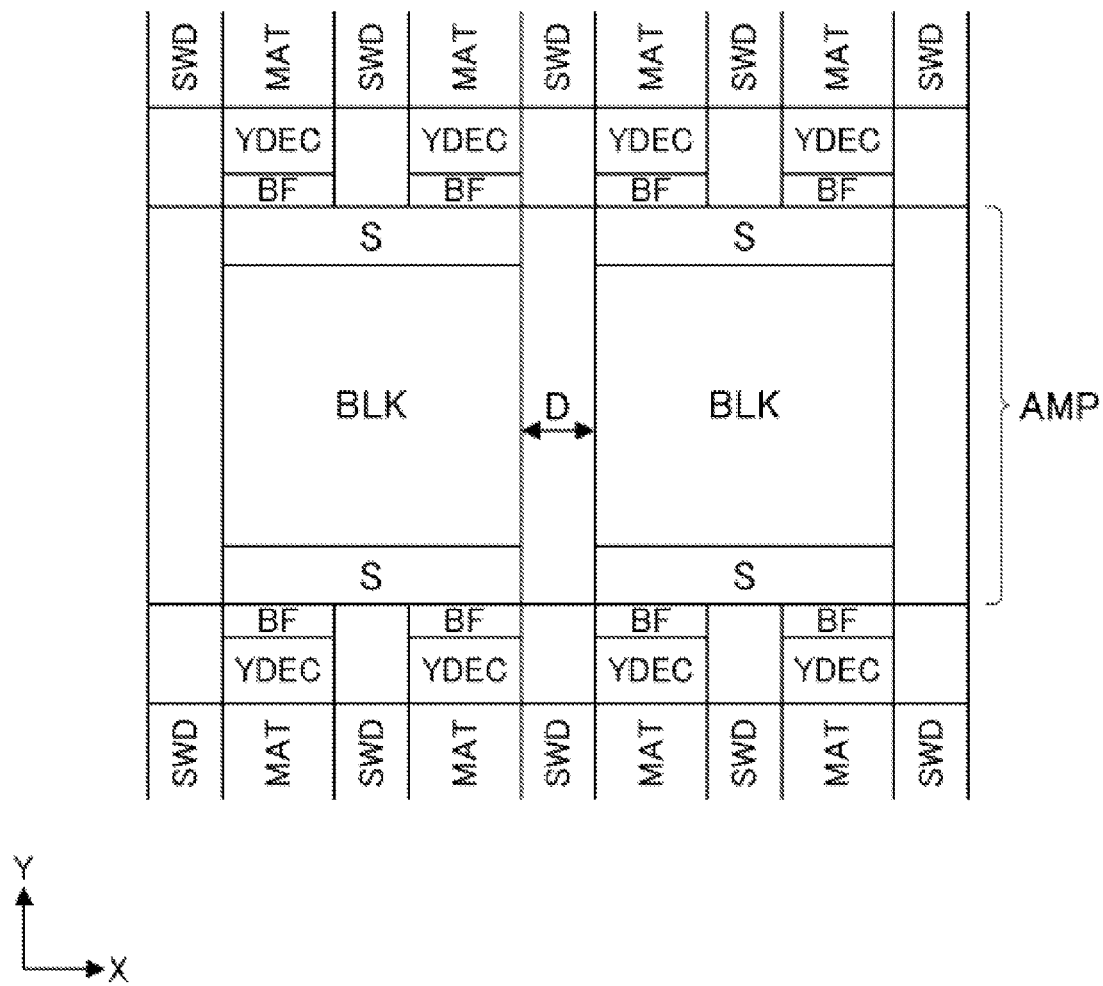
FIG. 9 is a top view showing a layout of the main amplifier region AMP after shrinkage.

FIG. 8 is a top view showing a layout of the main amplifier region AMP before shrinkage, and FIG. 9 is a top view showing a layout of the main amplifier region AMP after the shrinkage.

As shown in FIG. 8 and FIG. 9, a reduction of the chip size in a DRAM can be achieved by the reduction of the size of the memory cell array; the peripheral circuits tend to have a lower reduction rate in comparison with that of the memory cell array. At least for this reason, it might be difficult to also reduce the size of the main amplifier AMP at the same rate as the memory cell array ARY. However, in the case when the memory cell array ARY is shrunk, the length in the X-direction of the main amplifier region AMP might be made coincident with the length in the X-direction of the memory cell array ARY. Therefore, when the shrinking process is carried out, a distance D between the main amplifier blocks BLK adjacent to each other in the X-direction might become narrower, as shown in FIG. 9.

When the distance D between the main amplifier blocks BLK becomes narrower, some portions of the various kinds of circuit blocks, such as power-supply circuits, etc., disposed between the main amplifier blocks BLK before the shrinkage as shown in FIG. 8, might shift to spaces S newly formed on the two sides in the Y-direction of the main amplifier block BLK, after the shrinkage as shown in FIG. 9.

Figure 10:
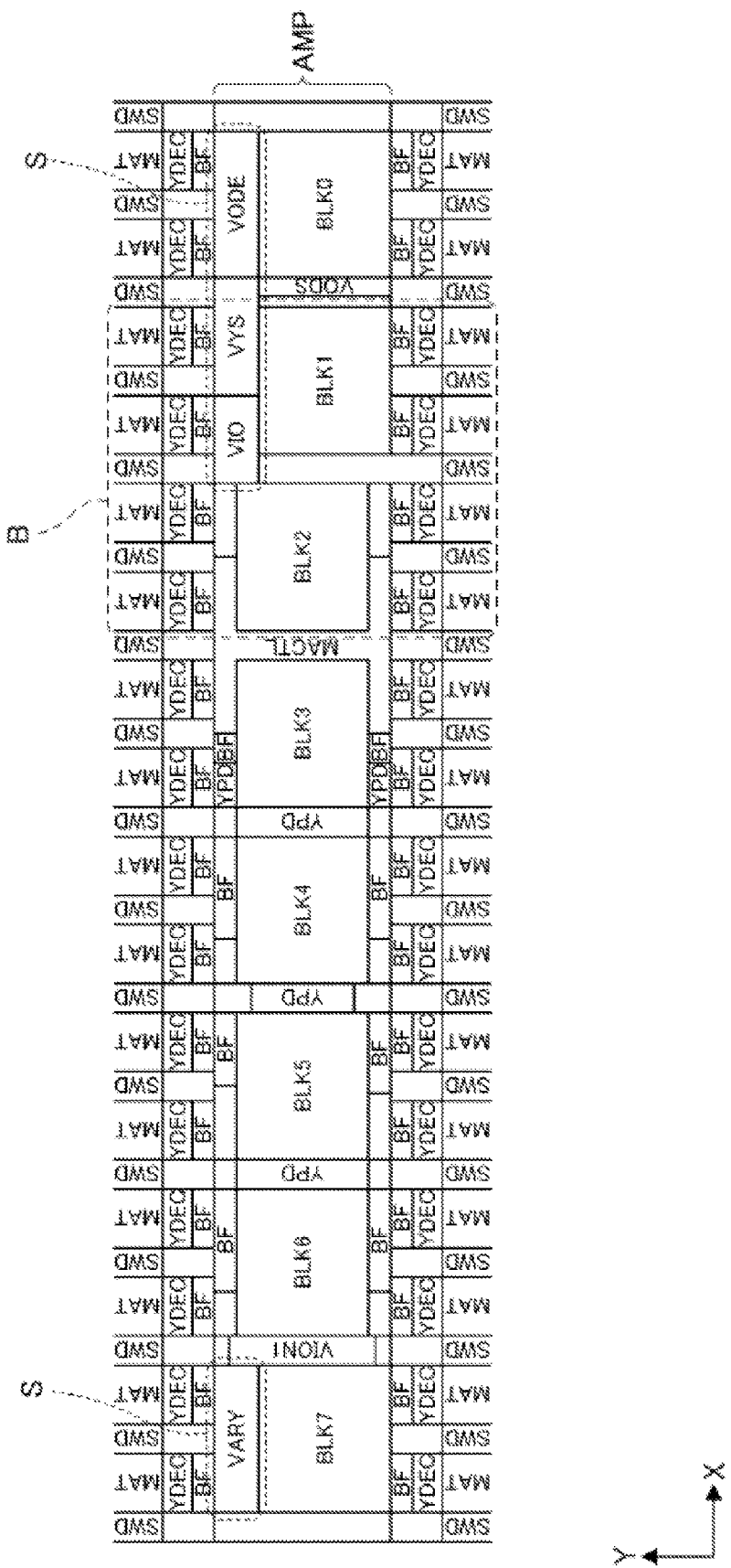
FIG. 10 is a top view showing a layout of a main amplifier region AMP as a prototype.

However, with respect to a circuit block that may have a comparatively larger circuit size, such as a power supply circuit, not easily disposed in a divided manner or changed in its shape, it may sometimes not be housed in the spaces S. In such a case, as shown in FIG. 10, one portion of the main amplifier block BLK might be offset in the Y-direction so as to expand the spaces S in the Y-direction. In an embodiment as shown in FIG. 10, three main amplifier blocks BLK0, BLK1 and BLK7 are offset onto the lower side so that the spaces S on the upper sides of the main amplifier blocks BLK0, BLK1 and BLK7 are expanded. In the corresponding spaces S, auxiliary circuits, for example, power supply circuits for use in generating inner electric potentials VODE, VYS, VIO and VARY are disposed.

Figure 11:
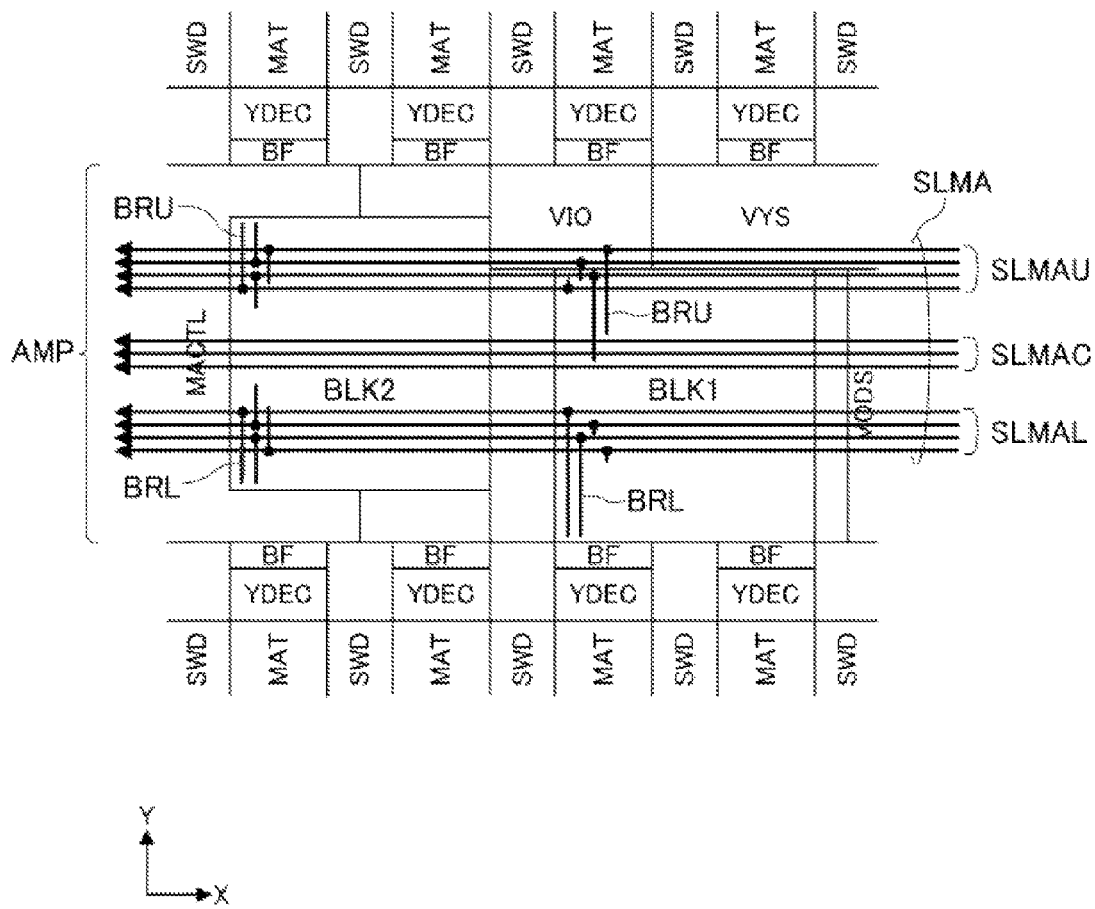
FIG. 11 is an enlarged top view of a region B as shown in FIG. 10.

FIG. 11 shows an expanded top view of a region B as shown in FIG. 10.

As shown in FIG. 11, the main amplifier BLK2 is disposed in the center in the Y-direction, while the main amplifier BLK1 is disposed so as to be offset toward a lower side in the Y-direction. As a result, the lengths of the branch wires BRU and BRL may become different from each other between the main amplifier block BLK1 and the main amplifier block BLK2. Additionally, black dots in FIG. 11 indicate contact plugs that connect the conductors extending in the XY direction to each other. Moreover, each of the conductors extending in the Y direction has a first end on which the contact plug is formed, and a second end on which a contact plug (not shown) that connects the first end to a circuit element formed inside the main amplifier is formed. In an embodiment as shown in FIG. 11, although the total length of the branch conductor BRU is not different so much between the main amplifier blocks BLK1 and BLK2, the total length of the branch conductor BRL of the main amplifier BLK1 is longer than that of the main amplifier BLK2. Additionally, the contact plugs, which are formed on the intersections of the wires extending in the XY direction, are installed line-symmetrically, with the conductor SLMAC serving as its axis. Moreover, the layout of elements located on the respective blocks is the same. Therefore, the positions of the second ends of the branch wires that extend in the Y-direction may be the same in the respective main amplifier blocks.

In an embodiment as shown in FIG. 10, there may be three main amplifier blocks, each offset toward a lower side in the Y-direction. Therefore, as a result, the load of the signal conductor SLMAL may become heavier than the load of the signal conductor SLMAU, and thus may result in a difference in characteristics between a case in which a read/write operation is carried out on the memory cell arrays ARYU and a case in which a read/write operation is carried out on the memory cell array ARYL. Since this difference in characteristics may cause a reduction of the operation margin, it may be reduced or eliminated in a semiconductor device for carrying out high-speed operations.

Some of the embodiments to be explained below might make it possible to reduce these problems. The following description will explain some embodiments of the disclosure.

Figure 12:
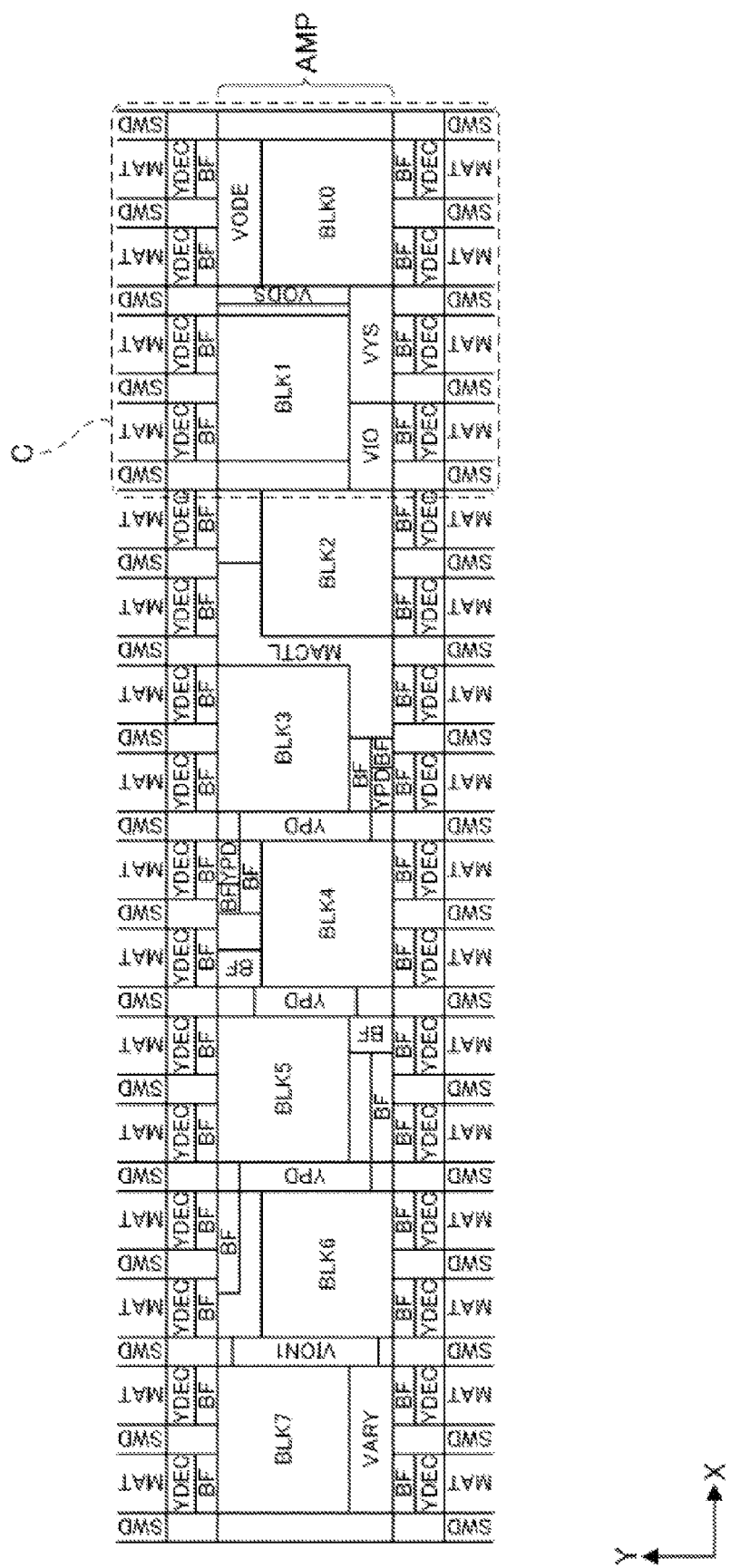
FIG. 12 is a top view showing a layout of a main amplifier region AMP in accordance with a first embodiment.

FIG. 12 is a top view showing a layout of a main amplifier region AMP in accordance with the first embodiment.

As shown in FIG. 12, the main amplifier blocks BLK included in the main amplifier region AMP are alternately offset onto the upper side and the lower side in the Y-direction. In some embodiments, the main amplifier blocks BLK0, BLK2, BLK4 and BLK6 are offset onto the lower side (onto the memory cell array ARY side) in the Y-direction, and the main amplifier blocks BLK1, BLK3, BLK5 and BLK7 are offset onto the upper side (onto the memory cell array ARU side) in the Y-direction. In the other words, the main amplifier block BLK7 is disposed closer to the upper side than the lower side. That is, the main amplifier block BLK7 is disposed so as to deviate toward the upper side from a center position between the upper side and the lower side. In the respective main amplifier blocks BLK, the offset amounts when seen from the center in the Y-direction are constant. It is noted that adjacent the two main amplifier blocks, e.g. BLK0, and BLK1, are most adjacently placed. It is also noted that the memory mats MAT as memory cell arrays are placed at a vertical line with an intervention with the associated main amplifier, and are defined by most adjacently placed to each other. It is also noted that the main amplifiers BLK0 to BLK7 are placed in a horizontal line.

Therefore, a distance from each of the main amplifier blocks such as BLK0, BLK2, BLK4 and BLK6 to the memory mat MAT on the memory cell array ARYL side is equal to a distance from each of the main amplifier blocks such as BLK1, BLK3, BLK5 and BLK7 to the memory mat MAT on the memory cell array ARYU side, and a distance from each of the main amplifier blocks such as BLK0, BLK2, BLK4 and BLK6 to the memory mat MAT on the memory cell array ARYU side is equal to a distance from each of the main amplifier blocks such as BLK1, BLK3, BLK5 and BLK7 to the memory mat MAT on the memory cell array ARYL side.

Figure 13:
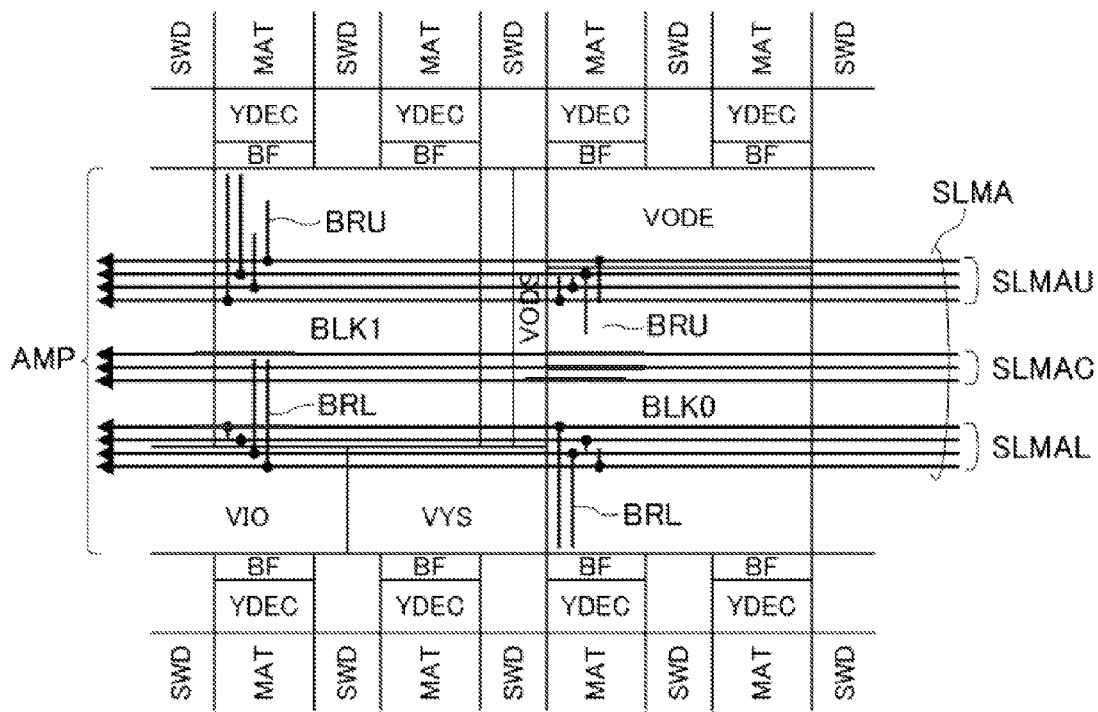
FIG. 13 is an enlarged top view of a region C as shown in FIG. 12.

FIG. 13 shows an enlarged top view of a region C as shown in FIG. 12.

As shown in FIG. 13, the main amplifier BLK0 is disposed so as to be offset toward a lower side in the Y-direction, while the main amplifier BLK1 is disposed so as to be offset toward an upper side in the Y-direction. As a result, the lengths of the branch conductors BRU and BRL become different from each other between the main amplifier block BLK0 and the main amplifier block BLK1. In some embodiments, with respect to the total length of the branch conductors BRU, the length of the main amplifier block BLK1 is longer than the length of the main amplifier block BLK0, and in contrast, with respect to the total length of the branch conductors BRL, the length of the main amplifier block BLK0 is longer than the length of the main amplifier block BLK1.

Moreover, in the first embodiment as shown in FIG. 12, there are four main amplifier blocks BLK, each offset toward a lower side in the Y-direction, and there are also four main amplifier blocks BLK, each offset toward an upper side in the Y-direction; therefore, the load of the signal conductor SLMAU and the load of the signal conductor SLMAL become substantially the same. With such a configuration, there is little difference in characteristics between a case in which a read/write operation is carried out on the memory cell arrays ARYU and a case in which a read/write operation is carried out on the memory cell array ARYL, and it becomes possible to provide a sufficient operation margin in comparison with the case in which the layout as shown in FIG. 10 is adopted. It is noted that the signal conductors SLMAs extend over the main amplifiers (or the main amplifier circuits) BLK1, BLK2, e.g., directly or sidelong over the amplifier circuits.

Moreover, since the layout of the respective main amplifier blocks BLK is offset, it may be possible to form a circuit block that has a comparatively large circuit size, such as a power supply circuit, that is not usually disposed in a divided manner or changed in its shape (for example, power supply circuits for use in generating inner electric potentials, VODE, VYS, VIO and VARY). Additionally, with respect to a circuit block having a comparatively small circuit size, it may be disposed between the main amplifier blocks BLK that are adjacent to each other in the X-direction. In an embodiment as shown in FIG. 12, each of the power supply circuits for generating inner electric potentials VODS and VION1 is disposed between the main amplifier blocks BLK. In addition, with respect to some of a control circuit MACTL for generating a control signal for the main amplifier MA, a pre-decoder YPD for pre-decoding a column address, and a buffer circuit BF for buffering a pre-decode signal, each of them may be disposed between the main amplifier blocks BLK.

In this manner, in accordance with the layout of some embodiments, since the loads of the signal conductor SLMAU and the signal conductor SLMAL become substantially the same, the characteristic in the case in which a read/write operation is carried out on the memory cell array ARYU and the characteristic in the case in which a read/write operation is carried out on the memory cell array ARYL can be made substantially the same.

Figure 14:
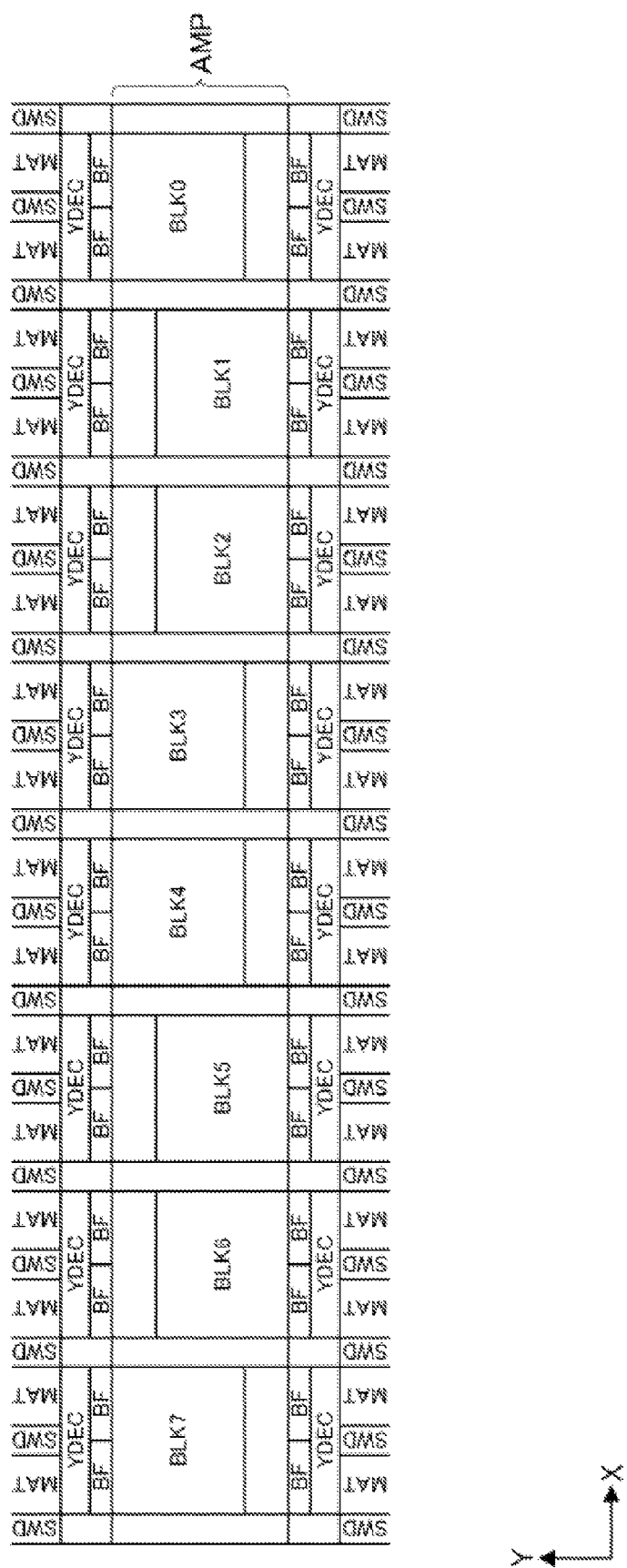
FIG. 14 is a top view showing a layout of a main amplifier region AMP in accordance with a second embodiment.

FIG. 14 is a top view showing a layout of a main amplifier region AMP in accordance with a second embodiment.

As shown in FIG. 14, the main amplifier blocks BLK0, BLK3, BLK4 and BLK7 are offset onto the upper side in the Y-direction (the memory cell array ARYU side), and the main amplifier blocks BLK1, BLK2, BLK5 and BLK6 are offset onto the lower side in the Y-direction (the memory cell array ARYL side). In the present embodiment also, in the respective main amplifier blocks BLK, the offset amounts, when seen from the center in the Y-direction, are constant.

In the present embodiment also, there are four main amplifier blocks BLK, each offset toward a lower side in the Y-direction, and there are also four main amplifier blocks BLK, each offset toward an upper side in the Y-direction; therefore, the load of the signal conductor SLMAU and the load of the signal conductor SLMAL become substantially the same. With this configuration, the same effects as those of the first embodiment may be obtained. In the present disclosure, it is not essential to alternately dispose the main amplifier blocks BLK offset toward the upper side and the main amplifier blocks BLK offset toward the lower side.

Figure 15:
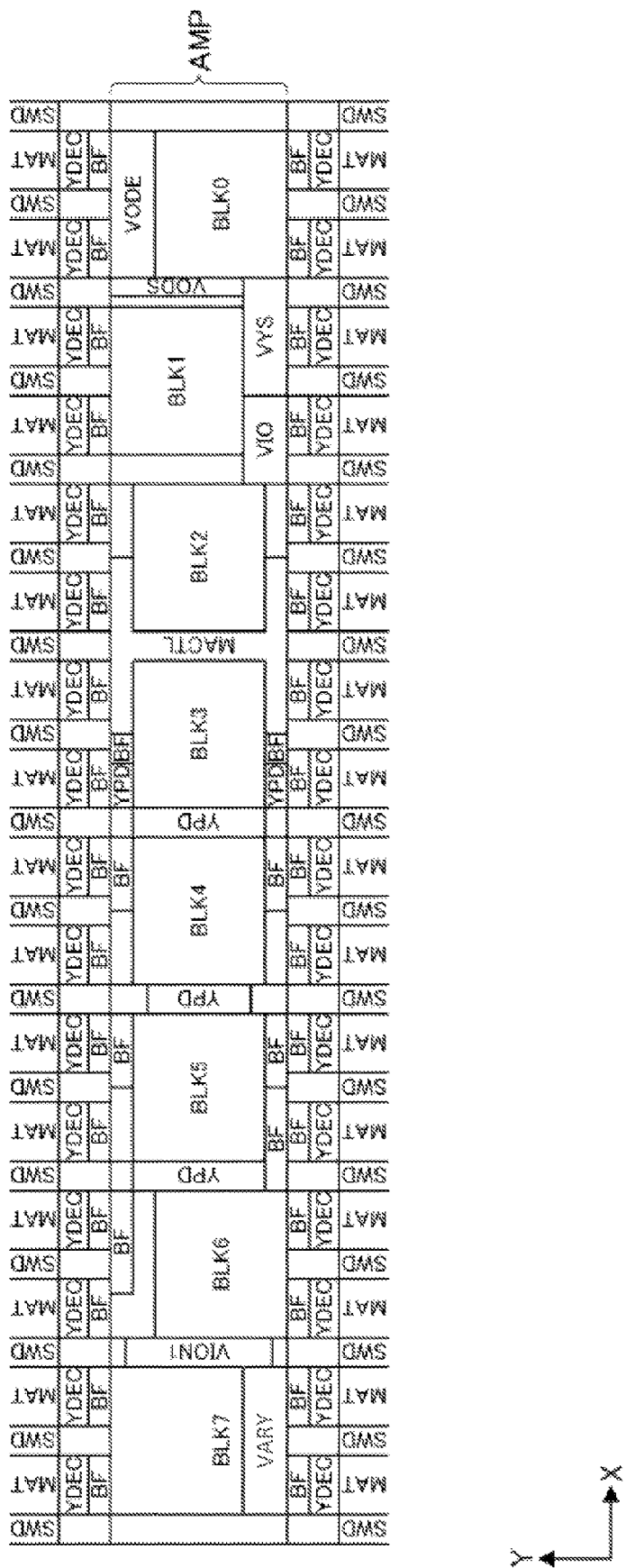
FIG. 15 is a top view showing a layout of a main amplifier region AMP in accordance with a third embodiment.

FIG. 15 is a top view showing a layout of a main amplifier region AMP in accordance with a third embodiment.

As shown in FIG. 15, the main amplifier blocks BLK0 and BLK6 are offset onto the lower side in the Y-direction (the memory cell array ARYL side), and the main amplifier blocks BLK1 and BLK7 are offset onto the upper side in the Y-direction (the memory cell array ARYU side). In the present embodiment also, the offset amounts of the main amplifier blocks BLK0, BLK1, BLK6 and BLK7, when seen from the center in the Y-direction, are constant.

With respect to the other main amplifier blocks BLK2 to BLK5, no offset is given, and they are laid out in the center in the Y-direction. That is, the sizes of the spacers S formed on the upper side and lower side of the main amplifier blocks BLK2 to BLK5 are mutually equal to each other. Thus, with respect to the main amplifier blocks BLK2 to BLK5 having no offset, any difference hardly exists in the loads of the signal conductor SLMAU and the signal conductor SLMAL.

Moreover, in the present embodiment, since there are two main amplifier blocks BLK offset onto the lower side in the Y-direction and there are also two main amplifier blocks BLK offset onto the upper side in the Y-direction, the load of the signal conductor SLMAU and the load of the signal conductor SLMAL are substantially the same. With this configuration, the same effects as those of the first embodiment can be obtained. In this manner, in the present disclosure, it is not essential to offset all the main amplifier blocks BLK.

Figure 16:
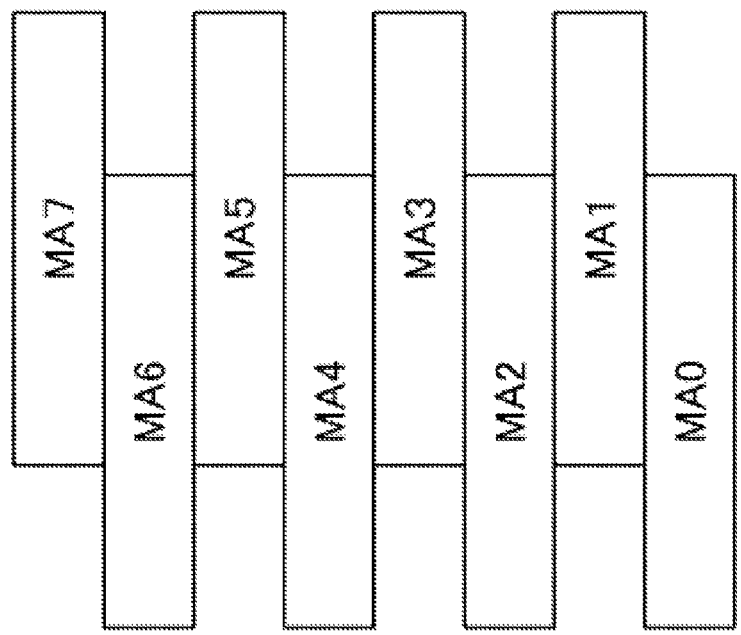
FIG. 16 is a top view showing a layout of a main amplifier block BLK in accordance with a fourth embodiment.
Figure 16:
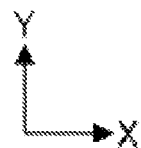

FIG. 16 is a top view showing a layout of main amplifier blocks BLK in accordance with a fourth embodiment.

As shown in FIG. 16, in the present embodiment, the entire main blocks BLK are not offset, but main amplifiers MA included in the main amplifier blocks BLK are offset. In some embodiments, the main amplifiers MA0, MA2, MA4 and MA6 are offset onto the lower side (memory cell array ARYL side) in the Y-direction, and the main amplifiers MA1, MA3, MA5 and MA7 are offset onto the upper side (memory array ARYU side). In the present embodiment also, the offset amounts, when seen from the center in the Y-direction, are constant.

With this configuration also, it is possible to make the load of the signal conductor SLMAU and the load of the signal conductor SLMAL uniform with each other. Additionally, in the present embodiment also, it is not essential to alternately dispose the main amplifiers MA offset onto the upper side and the main amplifiers MA offset onto the lower side (see the second embodiment), and it is also not essential to offset all the main amplifiers MA (see the third embodiment).

CONCLUSION

In some embodiments, a semiconductor device may include first and second memory cell arrays arranged in line in a first direction with a first space therebetween, third and fourth memory cell arrays arranged in line in the first direction with a second space therebetween, the third and first memory cell arrays being arranged in line in a second direction that is substantially perpendicular to the first direction, the fourth and second memory cell arrays being arranged in line in the second direction, a first main amplifier circuit provided to amplify data signals read out from each of the first and second memory cell arrays, the first main amplifier being disposed in the first space so as to come closer to the first memory cell array than the second memory cell array, and a second main amplifier circuit provided to amplify data signals read out from each of the third and fourth memory cell arrays, the second main amplifier being disposed in the second space so as to come closer to the fourth memory cell array than the third memory cell array.

In some embodiments, a semiconductor device may include first and second memory cell arrays arranged in line in a first direction with an intervention of a first main amplifier circuit therebetween, where the first main amplifier circuit is dedicated to amplifying data signals read out from each of the first and second memory cell arrays, and third and fourth memory cell arrays arranged in line in the first direction with an intervention of a second main amplifier circuit therebetween where the second main amplifier circuit is dedicated to amplifying data signals read out from each of the third and fourth memory cell arrays. The first and third memory cell arrays are arranged in line in a second direction that is substantially perpendicular to the first direction and the second and fourth memory cell arrays is arranged in line in the second direction. The first main amplifier is disposed so as to deviate toward the first memory cell array from a center position between the first and second memory cell arrays, and the second main amplifier is disposed to deviate toward the fourth memory cell array from a center position between the third and fourth memory cell arrays.

In some embodiments, a semiconductor device may include a first memory cell array, a second memory cell array, a first main amplifier and a first auxiliary circuit arranged in line in a first direction, the first main amplifier being between the first memory cell array and the first auxiliary circuit, and the first auxiliary circuit being between the first main amplifier and the second memory cell array, the first main amplifier circuit being dedicated to amplifying data signals read out from each of the first and second memory cell arrays, and a third memory cell array, a fourth memory cell array, a second main amplifier and a second auxiliary circuit arranged in line in the first direction, the third and first memory cell arrays being arranged in line in a second direction that is substantially perpendicular to the first direction, the fourth and second memory cell arrays being arranged in line in the second direction, the second main amplifier circuit being dedicated to amplifying data signals read out from each of the third and fourth memory cell arrays, the second main amplifier being between the fourth memory cell array and the second auxiliary circuit, and the second auxiliary circuit being between the second main amplifier and the third memory cell array.

Although various embodiments have been described above, the disclosure is not limited to these embodiments. It will be appreciated by those of ordinary skill in the art that various changes in form and details may be made therein without departing from the scope of the present disclosure, as defined by the claims.

What is claimed is:
1. A semiconductor device comprising:
a first memory bank including first and second memory cell arrays arranged in line in a first direction with a first space therebetween;
a second memory bank including third and fourth memory cell arrays arranged in line in the first direction with a second space therebetween, the third and first memory cell arrays being arranged in line in a second direction that is substantially perpendicular to the first direction, and the fourth and second memory cell arrays being arranged in line in the second direction;

a first main amplifier circuit to amplify data signals read out from each of the first and second memory cell arrays within the first memory bank, the first main amplifier being disposed in the first space within the first memory bank closer to the first memory cell array than to the second memory cell array; and a second main amplifier circuit to amplify data signals read out from each of the third and fourth memory cell arrays within the first memory bank, the second main amplifier being disposed in the second space within the second memory bank closer to the fourth memory cell array than to the third memory cell array.

2. The semiconductor device as claimed in claim 1, further comprising:

a first power supply circuit between the first main amplifier circuit and the second memory cell array, and a second power supply circuit between the second main amplifier circuits and the first memory cell array.

3. The semiconductor device as claimed in claim 1, wherein the first and second main amplifier circuits are adjacently placed to each other.

4. The semiconductor device as claimed in claim 1, further comprising:

a third memory bank including fifth and sixth memory cell arrays arranged in line in the first direction with a third space therebetween, the fifth memory cell array being arranged in line in the second direction between the first and third memory cell arrays, and the sixth memory cell array being arranged in line in the second direction between the second and fourth memory cell arrays; and a third main amplifier circuit to amplify data signals read out from each of the fifth and sixth memory cell arrays within the third memory bank, the third main amplifier being disposed in the third space within the third memory bank closer to the fifth memory cell array than to the sixth memory cell array.

5. The semiconductor device as claimed in claim 1, further comprising:

a third memory bank including fifth and sixth memory cell arrays arranged in line in the first direction with a third space therebetween, the fifth memory cell array being arranged in line in the second direction between the first and third memory cell arrays, and the sixth memory cell array being arranged in line in the second direction between the second and fourth memory cell arrays; and a third main amplifier circuit to amplify data signals read out from each of the fifth and sixth memory cell arrays within the third memory bank, the third main amplifier being disposed in the third space within the third memory bank so that a distance between the third main amplifier circuit and the fifth memory cell array is substantially the same as a distance between the third main amplifier circuit and the sixth memory cell array.

6. The semiconductor device as claimed in claim 1, further comprising:

a control conductor extending over the first and second main amplifier circuits in the second direction; and a plurality of branch conductors extending in the first direction to be connected between the control conductor and the first and second main amplifier circuits, respectively.

7. The semiconductor device as claimed in claim 6, wherein the control conductor includes a first control conductor disposed closer to the first and third memory cell arrays than to the second and fourth memory cell arrays, and a second control conductor disposed closer to the second and fourth memory cell arrays than to the first and third memory cell arrays.

8. A semiconductor device comprising:

a first memory bank including first and second memory cell arrays arranged in line in a first direction with an intervention of a first main amplifier circuit therebetween, the first main amplifier circuit being configured to amplify data signals read out from each of the first and second memory cell arrays; and a second memory bank including third and fourth memory cell arrays arranged in line in the first direction with an intervention of a second main amplifier circuit therebetween, the second main amplifier circuit being configured to amplify data signals read out from each of the third and fourth memory cell arrays;

the first and third memory cell arrays being arranged in line in a second direction that is substantially perpendicular to the first direction;

the second and fourth memory cell arrays being arranged in line in the second direction;

the first main amplifier being disposed within the first memory bank to deviate toward the first memory cell array from a center position between the first and second memory cell arrays; and the second main amplifier being disposed within the second memory bank to deviate toward the fourth memory cell array from a center position between the third and fourth memory cell arrays.

9. The semiconductor device as claimed in claim 8, further comprising:

a first power supply circuit between the first main amplifier and the second memory cell array, and a second power supply circuit between the second main amplifier and the first memory cell array.

10. The semiconductor device as claimed in claim 8, wherein the first and second main amplifiers are adjacently placed to each other.

11. The semiconductor device as claimed in claim 8, further comprising:

a third memory bank including fifth and sixth memory cell arrays arranged in line in the first direction with a third space therebetween, the fifth memory cell array being arranged in line in the second direction between the first and third memory cell arrays, and the sixth memory cell array being arranged in line in the second direction between the second and fourth memory cell arrays; and a third main amplifier to amplify data signals read out from each of the fifth and sixth memory cell arrays within the third memory bank, the third main amplifier being disposed in the third space within the third memory bank closer to the fifth memory cell array than to the sixth memory cell array.

12. The semiconductor device as claimed in claim 8, further comprising:

a third memory bank including fifth and sixth memory cell arrays arranged in line in the first direction with a third space therebetween, the fifth memory cell array being arranged in line in the second direction between the first and third memory cell arrays, and the sixth memory cell array being arranged in line in the second direction between the second and fourth memory cell arrays; and a third main amplifier to amplify data signals read out from each of the fifth and sixth memory cell arrays within the third memory bank, the third main amplifier being disposed in the third space within the third memory bank so that a distance between the third main amplifier and the fifth memory cell array is substantially the same as a distance between the third main amplifier and the sixth memory cell array.

13. The semiconductor device as claimed in claim 8, further comprising:
    a control conductor extending over the first and second main amplifiers in the second direction; and
    a plurality of branch conductors extending in the first direction to be connected between the control conductor and the first and second main amplifiers, respectively.

14. The semiconductor device as claimed in claim 13, wherein the control conductor includes a first control conductor disposed closer to the first and third memory cell arrays than to the second and fourth memory cell arras, and a second control conductor disposed closer to the second and fourth memory cell arrays than to the first and third memory cell arrays.

15. A semiconductor device comprising:
    a first memory bank including a first memory cell array, a second memory cell array, a first main amplifier and a first auxiliary circuit arranged in line in a first direction, the first main amplifier being between the first memory cell array and the first auxiliary circuit, the first auxiliary circuit being between the first main amplifier and the second memory cell array, and the first main amplifier circuit being to amplify data signals read out from each of the first and second memory cell arrays; and
    a second memory bank including a third memory cell array, a fourth memory cell array, a second main amplifier and a second auxiliary circuit arranged in line in the first direction, the third and first memory cell arrays being arranged in line in a second direction that is substantially perpendicular to the first direction, the fourth and second memory cell arrays being arranged in line in the second direction, the second main amplifier circuit being to amplify data signals read out from each of the third and fourth memory cell arrays, the second main amplifier being between the fourth memory cell array and the second auxiliary circuit, and the second auxiliary circuit being between the second main amplifier and the third memory cell array.

16. The semiconductor device as claimed in claim 15, wherein the first auxiliary circuit includes a first power supply circuit, and the second auxiliary circuit includes a second power supply circuit.

17. The semiconductor device as claimed in claim 15, wherein the first and second main amplifiers are adjacently placed to each other.

18. The semiconductor device as claimed in claim 15, further comprising:
    a third memory bank including a fifth memory cell array, a sixth memory cell array, a third main amplifier and a third auxiliary circuit arranged in line in the first direction, the fifth and first memory cell arrays being arranged in line in the second direction, the sixth and second memory cell arrays being arranged in line in the second direction, the third main amplifier circuit being to amplify data signals read out from each of the fifth and sixth memory cell arrays, the third main amplifier being between the sixth memory cell array and the third auxiliary circuit, and the third auxiliary circuit being between the third main amplifier and the fifth memory cell array.

19. The semiconductor device as claimed in claim 15, further comprising:
    a third memory bank including a fifth memory cell array, a sixth memory cell array, a third main amplifier and a third auxiliary circuit arranged in line in the first direction, the fifth and first memory cell arrays being arranged in line in the second direction, the sixth and second memory cell arrays being arranged in line in the second direction, the third main amplifier circuit being to amplify data signals read out from each of the fifth and sixth memory cell arrays, the third main amplifier being between the sixth memory cell array and the third auxiliary circuit, and the third auxiliary circuit being between the third main amplifier and the fifth memory cell array.

20. The semiconductor device as claimed in claim 15, further comprising:
    a control conductor extending over the first and second main amplifiers in the second direction; and
    a plurality of branch conductors extending in the first direction to be connected between the control conductor and the first and second main amplifiers, respectively.

* * * * *